United States Patent [19]
Bandyopadhyay et al.

[11] Patent Number: 6,090,703
[45] Date of Patent: Jul. 18, 2000

[54] METHOD OF FORMING AN INTEGRATED CIRCUIT HAVING CONDUCTORS OF ENHANCED CROSS-SECTIONAL AREA WITH ETCH STOP BARRIER LAYER

[75] Inventors: Basab Bandyopadhyay; H. Jim Fulford, Jr.; William S. Brennan; Fred N. Hause; Robert Dawson, all of Austin; Mark W. Michael, Cedar Park, all of Tex.

[73] Assignee: Advanced Micro Devices, Inc., Sunnyvale, Calif.

[21] Appl. No.: 09/165,765

[22] Filed: Oct. 2, 1998

Related U.S. Application Data

[62] Division of application No. 08/748,812, Nov. 14, 1996, Pat. No. 5,847,462.

[51] Int. Cl.$^7$ .............................................. H01L 21/4763
[52] U.S. Cl. ........................................ 438/637; 438/634
[58] Field of Search ................................... 438/637, 634, 438/627, 638, 633, 629

[56] References Cited

U.S. PATENT DOCUMENTS

| | | | |
|---|---|---|---|
| 4,789,648 | 12/1988 | Chow et al. | 437/225 |
| 4,832,789 | 5/1989 | Cochran et al. | |
| 4,905,068 | 2/1990 | Satoh et al. | |

(List continued on next page.)

FOREIGN PATENT DOCUMENTS

| | | |
|---|---|---|
| 0244858 | 10/1988 | Japan . |
| 2 268 329 | 1/1994 | United Kingdom . |

OTHER PUBLICATIONS

S.M. Sze, VLSI Technology, second edition, p. 381–384, 1988.
Rudolf F. Graf, Modern Dictionary of Electronics, sixth edition, p. 507, 560, 1103, 1997.
Charles A. Harper and Martin B. Miller, Electronic Packaging, Microelectronics, and Interconnection Dictionary, p. 105, 116, 208, 1993.
International Electron Devices Meetin, Technical Digest, San Francisco, CA., "A Quarter–Micron Planarized Interconnection Technology with Self–Aligned Plug," Ueno, et al. 5 pages, Dec. 13–16, 1992.
IBM Technical Disclosure Bulletin, "Damascene: Optimized Etch Stop Structure and Method," vol. 36, No. 11, Nov. 1993, p. 649.
IBM Technical Disclosure Bulletin, "Displaced metal Conductor," vol. 36, No. 11, Nov. 1993, pp. 599–602.

*Primary Examiner*—Charles Bowers
*Assistant Examiner*—Martin Sulsky
*Attorney, Agent, or Firm*—Conley, Rose & Tayon, P.C.; Robert C. Kowert

[57] ABSTRACT

A interconnect structure is provided having a conductor with enhanced thickness. The conductor includes an upper portion and a lower portion, wherein the lower portion geometry is sufficient to increase the current-carrying capacity beyond that provided by the upper portion. The lower portion is formed by filling a trench within an upper dielectric region, and the upper portion is formed by selectively removing a conductive material from the upper dielectric surface except for regions directly above the lower portion. The upper and lower portions thereby form a conductor of enhanced cross-section which can be produced by modifying a via-etch mask, rather than having to reconfigure and/or move interconnect features formed by a metal mask.

10 Claims, 4 Drawing Sheets

6,090,703
Page 2

U.S. PATENT DOCUMENTS

| | | | |
|---|---|---|---|
| 4,987,099 | 1/1991 | Flanner . | |
| 4,996,133 | 2/1991 | Brighton et al. . | |
| 5,010,039 | 4/1991 | Ku et al. . | |
| 5,034,347 | 7/1991 | Kakihana . | |
| 5,034,799 | 7/1991 | Tomita et al. . | |
| 5,189,506 | 2/1993 | Cronin et al. . | |
| 5,204,286 | 4/1993 | Doan . | |
| 5,286,675 | 2/1994 | Chen et al. . | |
| 5,300,456 | 4/1994 | Tigelaar et al. . | |
| 5,312,777 | 5/1994 | Cronin et al. . | |
| 5,328,553 | 7/1994 | Poon . | |
| 5,354,711 | 10/1994 | Heitzmann et al. . | |
| 5,385,867 | 1/1995 | Ueda et al. . | |
| 5,451,551 | 9/1995 | Krishnan et al. | 437/241 |
| 5,451,804 | 9/1995 | Lur et al. . | |
| 5,530,262 | 6/1996 | Cronin et al. . | |
| 5,571,751 | 11/1996 | Chung . | |
| 5,596,230 | 1/1997 | Hong . | |
| 5,602,050 | 2/1997 | Sudo . | |
| 5,604,156 | 2/1997 | Chung et al. | 437/195 |
| 5,612,254 | 3/1997 | Mu et al. | 437/195 |
| 5,635,423 | 6/1997 | Huang et al. . | |
| 5,726,100 | 3/1998 | Givens . | |
| 5,728,619 | 3/1998 | Tsai et al. . | |
| 5,741,741 | 4/1998 | Tseng . | |
| 5,753,565 | 5/1998 | Becker . | |
| 5,759,911 | 6/1998 | Cronin et al. . | |
| 5,759,914 | 6/1998 | Park . | |
| 5,818,110 | 10/1998 | Cronin . | |
| 5,827,776 | 10/1998 | Bandyopadhyay et al. . | |
| 5,847,462 | 12/1998 | Bandyopadhyay et al. . | |
| 5,854,515 | 12/1998 | Bandyopadhyay et al. . | |
| 5,858,877 | 1/1999 | Dennison et al. . | |
| 5,869,396 | 2/1999 | Pan et al. | 438/647 |

METHOD OF FORMING AN INTEGRATED CIRCUIT HAVING CONDUCTORS OF ENHANCED CROSS-SECTIONAL AREA WITH ETCH STOP BARRIER LAYER

This application is a divisional of U.S. Ser. No. 08/748,812, filed on Nov. 14, 1996, now U.S. Pat. No. 5,847,462.

BACKGROUND OF THE INVENTION

1. Field of the Invention

This invention relates to semiconductor fabrication and more particularly to an integrated circuit which employs a multilevel interconnect structure having thickened conductors in regions of dense interconnect. The thickened conductors of enhanced cross-sectional area have potential for carrying larger amounts of current commensurate with wide conductors. However, minimum spacing requirements available in regions of dense interconnect prevent use of wide conductors.

2. Description of the Relevant Art

An integrated circuit includes numerous conductors extending across the topography of a monolithic substrate. A set of interconnect lines (or conductors) which serve to electrically connect two or more components within a system is generally referred to as a "bus". A collection of voltage levels are forwarded across the conductors to allow proper operation of the components. For example, a microprocessor is connected to memories and input/output devices by certain bus structures. There are numerous types of busses which are classified according to their operation. Examples of well-known types of busses include address busses, data busses and control busses.

Conductors within a bus generally extend partially parallel to each other across the semiconductor topography. The conductors are isolated from each other and from underlying conductive elements by a dielectric, a suitable dielectric being, for example, silicon dioxide ("oxide"). Conductors are thereby lithography patterned across the semiconductor topography, wherein the topography comprises a substrate with a dielectric placed thereon. Conductors are made from an electrically conductive material, a suitable material includes Al, Ti, Ta, W, Mo, polysilicon, or a combination thereof. The substrate includes any type of material which can retain dopant ions and the isolated conductivity regions brought about by those ions. Typically, the substrate is a silicon-based material which receives p-type or n-type ions. Generally speaking, interconnect lines (or conductors) are fashioned upon the topography and dielectrically spaced above an underlying conductor or substrate. Each conductor is dielectrically spaced from other conductors within the same level of conductors (i.e., substantially coplanar conductors) by a defined lateral distance. Each conductor is designed to carry a certain amount of current, based on the desired design and application. As a conductor carries current, a migration of conductive material occurs from one part of the conductor to another. Migration of material, i.e., electromigration, causes localized thinning of the conductor leading to a resistance increase. The useful lifetime of a conductor thereby decreases with decreasing conductor cross-sectional area.

Electromigration causes a reliability issue. Design results are used to calculate a minimum width of the conductor based upon current requirement through the conductor. In order to maintain relatively small conductor widths (i.e., to maintain a small die size), it would be desirable to derive a technique for reworking a conductor to enhance its current-carrying capability. The importance of rework is particularly acute if rework can be selectively performed on certain conductors but not all conductors within a die. Thus, in many design layouts, there may exist conductors which have less than a minimum specified width to pass electromigration specification. The normal procedure for increasing width of the conductor is to move neighboring conductors to allow for increase in conductor width, increase die size to allow for increase in conductor width, or jeopardize minimum conductor spacing adjacent to the widened conductor. These re-work scenarios are intolerable in most instances.

If a conductor cannot carry sufficient current for a desired application, the conductor is generally reconfigured in a manner involving a circuit revision or "design fix". In order to carry larger amounts of current, the reconfigured conductor can be made wider (i.e., wider in a lateral direction parallel to the semiconductor topography) than the other conductors. A negative consequence of widening a conductor is the encroachment of that conductor toward laterally spaced (neighboring) conductors. If adjacent conductors were originally configured a minimum space apart, one conductor cannot be made wider if the minimum spacing is violated. Thus, widening a conductor typically requires moving minimum-spaced, adjacent conductors away from the widened conductor. This reconfiguration may in certain instances be extremely burdensome and may impact the placement of numerous conductors arranged across the semiconductor die.

It would therefore be desirable to derive a technique for reworking a conductor to enhance its current-carrying capacity without having to reconfigure or move any other conductor arranged adjacent the enhanced conductor. The enhanced conductor must be one which can be readily reworked with minimal impact upon photolithography steps used in forming that conductor (or any other conductor upon the die). A technique must therefore be derived which can reconfigure select conductors in densely spaced areas without having to modify laterally adjacent conductors. This technique would be advantageous in circuit rework operations and would reduce the time required to produce circuit revisions. Enhancing a conductor's current-carrying capability without jeopardizing minimum conductor spacing would not only achieve current drive specifications but would do so without sacrificing propagation delay or cross-coupling noise.

SUMMARY OF THE INVENTION

The problems outlined above are in large part solved by modifying a conductor to enhance its current-carrying capability. The enhanced conductor is one having a larger cross-sectional area or, more specifically, is one which is thicker rather than wider.

The enhanced conductor is one that is thicker than many other conductors within a semiconductor die, and is certainly thicker than the metal layer which forms all other conductors within an interconnect level. A thicker conductor provides an overall conductor layout which does not violate minimum spacing rules. The larger cross-sectional area affords a greater current-carrying capacity. Also, the increase in cross-sectional area may be performed with material which is less susceptible to electromigration.

The rework technique hereof involves determining conductors which have insufficient current-carrying potential. Those conductors may then be reconfigured such that their thickness is increased rather than their width.

The present invention contemplates a plurality of conductors. The conductors comprise a pair of conductors, each having an upper surface and a lower surface. A first conductor is spaced partially between the pair of conductors. The first conductor includes a first upper surface and a first lower surface. The first upper surface is essentially coplanar with the upper surface of the pair of conductors. The first lower surface, however, is configured below the lower surface of the pair of conductors. The distance by which the first lower surface is below the lower surface of the pair of conductors is defined by a dielectric thickness of an upper dielectric layer within a two layer interlevel dielectric structure. The first conductor includes a lower portion comprising a barrier metal.

The present invention further contemplates a multilevel interconnect structure. The interconnect structure comprises a pair of conductors arranged on a first plane, defined herein as an elevational plane. The interconnect structure further comprises a first conductor having an upper portion and a lower portion. The upper portion of the first conductor is arranged on the first plane a spaced distance between the pair of conductors. The lower portion of the first conductor is arranged exclusively in a region directly below the upper portion of the first conductor. The lower portion includes a barrier layer material.

The present invention yet further contemplates a method for forming a multilevel interconnect structure. The method comprises providing a semiconductor topography and then depositing a first dielectric upon that topography. A barrier layer is formed and patterned on the dielectric to form an etch stop. A second dielectric is then formed on the first dielectric and on the etch stop. Portions of the dielectric are removed to the etch stop to form at least one trench spaced from at least one via which extends to semiconductor topography. A plug material is then deposited across the second dielectric and into the trench and via. The plug material is removed from the upper surface of the second dielectric to form a lower portion of the first conductor within the trench and a plug within the via. A conductive material is then deposited across the upper surface of the dielectric. The conductive material is then selectively removed in all regions except in regions directly above the lower portion and the contact. The conductive material remaining after it is selectively removed comprises an upper portion of a first conductor spaced between a pair of conductors.

BRIEF DESCRIPTION OF THE DRAWINGS

Other objects and advantages of the invention will become apparent upon reading the following detailed description and upon reference to the accompanying drawings in which.

Figure 1:
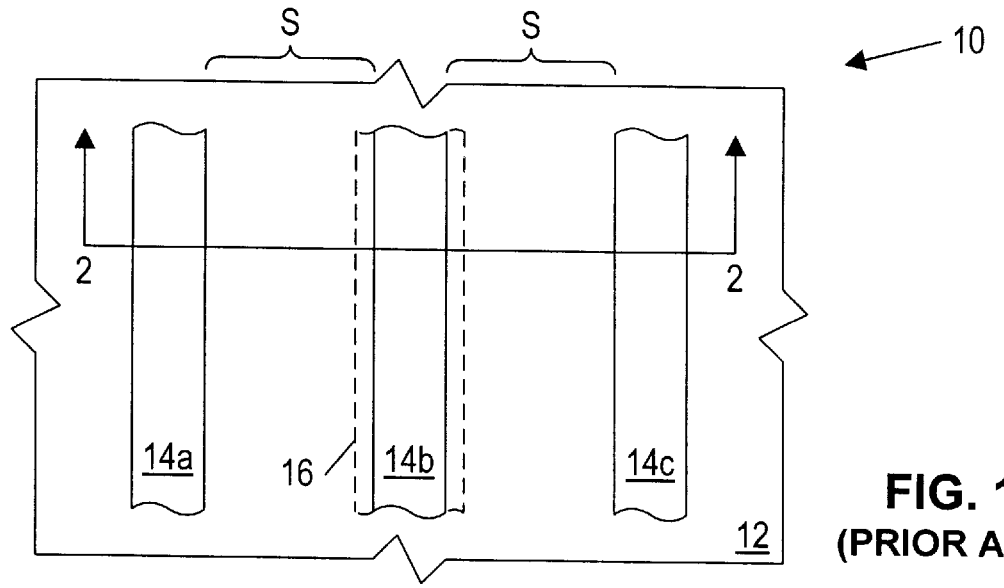
FIG. 1 is a partial, top plan view of a multilevel interconnect structure.

While the invention is susceptible to various modifications and alternative forms, specific embodiments thereof are shown by way of example in the drawings and will herein be described in detail. It should be understood, however, that the drawings and detailed description thereto are not intended to limit the invention to the particular form disclosed, but on the contrary, the intention is to cover all modifications, equivalents and alternatives falling within the spirit and scope of the present invention as defined by the appended claims.

DETAILED DESCRIPTION OF THE INVENTION

Turning now to the drawings, FIG. 1 illustrates a partial, top plan view of a multilevel interconnect structure 10. Structure 10 includes a topographical surface 12 upon which a plurality of conductors 14 are spaced. For sake of brevity, only three conductors of the plurality of conductors are shown. It is understood, however, that more than three conductors are patterned upon topographical surface 12. Conductors 14 include a first conductor 14b laterally spaced between a pair of conductors 14a and 14c. Conductors 14 include any substantially conductive material, and topographical surface 12 includes any insulated surface upon which conductors 14 can adhere.

If it is determined that first conductor 14b be reconfigured to handle a greater amount of current, then it can be advantageously reconfigured to handle that current. The first conductor 14b is enhanced not by increasing its lateral dimension, as shown by reference numeral 16. If conductor 14b is enhanced to the geometry shown at 16, then minimum spacing S will be jeopardized causing a potential shorting problem. Accordingly, increases in current-carrying capacity take place by increasing the thickness of first conductor 14b rather than its width. Increase in thickness is better illustrated in reference to FIG. 2.

Figure 2:
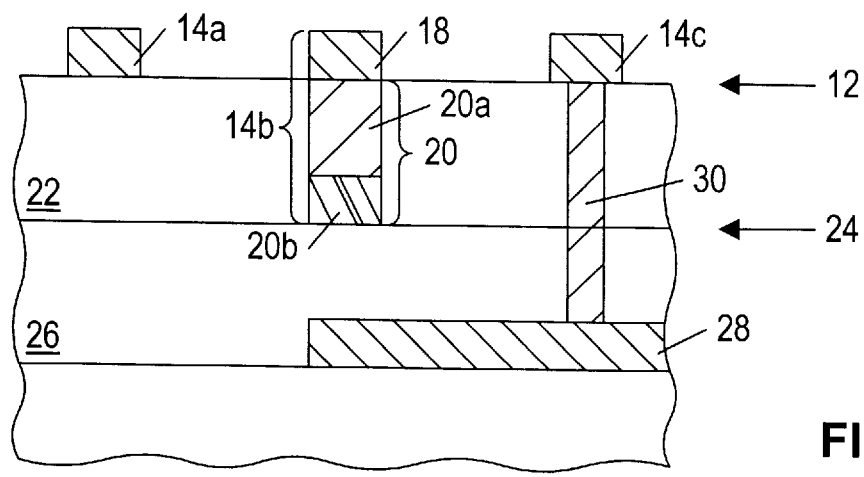
FIG. 2 is a cross-sectional view along plane 2 of FIG. 1.

Referring to FIG. 2, a cross-sectional view along plane 2 of FIG. 1 is shown. In particular, FIG. 2 illustrates conductors 14 patterned across topographical surface 12, and the relative thickness of each conductor. Enhancements to current-carrying capacity are achieved by increasing the thickness of first conductor 14b. As shown, increase in thickness does not cause a reduction in spacing between conductors and, accordingly, enhancements to thickness provides a better rework methodology than enhancements to width. First conductor 14b is shown partially formed within topographical surface 12. More specifically, conductor 14b includes an upper portion 18 and a lower portion 20. Upper portion 18 is substantially the same thickness, and is substantially coplanar with conductors 14a and 14c. Lower portion 20 is constrained entirely within a second dielectric 22. Lower portion 20 thereby extends from upper surface 12 to lower surface 24 of second dielectric 22. Lower portion 20 can be of different width than upper portion 18, if desired. Lower portion 20 comprises plug portion 20a and etch stop portion 20b.

Second dielectric 22 is deposited upon first dielectric 26, wherein first dielectric 26 and second dielectric 22 comprise an inter-level dielectric structure interposed between a substantially coplanar set of conductors 28 and substantially coplanar set of conductors 14a and 14c. If one or more conductors 28 are to be connected to one or more conductors 14, then a contact structure 30 exists.

Figure 3:
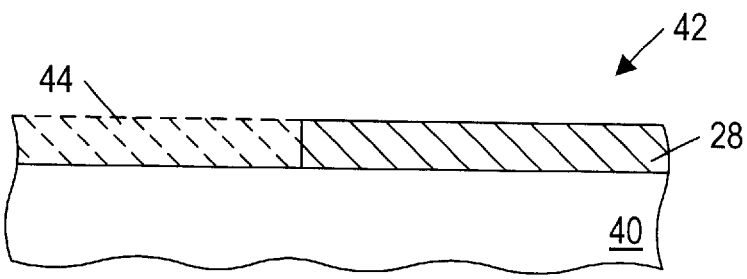
FIG. 3 is a cross-sectional view of a semiconductor topography along plane 2 showing formation of one or more first conductors (interconnect) formed upon the semiconductor topography.
Figure 3A:
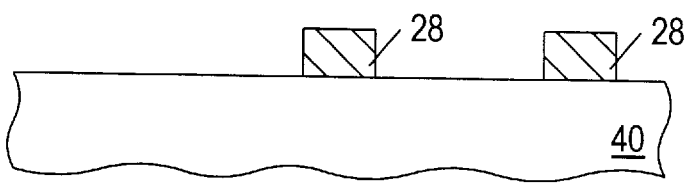
FIG. 3A is a 90° rotated view example of the topography of FIG. 3 after formation of the first conductors.

Turning now to FIGS. 3–10, a processing sequence used in forming interconnect structure 10 is shown. FIG. 3 illustrates an initial sequence in steps in which a semiconductor substrate 40 is provided. Substrate 40 includes a conductive material upon which an insulative material is formed. The conductive material can be, according to one embodiment, electrically active dopants or separately deposited conductive material. Once substrate 40 is provided having an upper surface, a conductive material 42 is deposited upon that surface, as shown. The conductive material 42 suitably includes a refractory metal, such as Ti, W, Al, TiN, Ta, TiW, etc. Preferably, conductive material 42 is blanket deposited across the entire substrate 40. Thereafter, portions of conductive material are removed, as shown by dashed lines 44, to produce a set of conductors 28. Conductive material 42 can be deposited using any suitable technique, an exemplary technique being sputter deposition or chemical-vapor deposition. Portions of conductive material 42 are removed, preferably by a lithography/etch sequence. FIG. 3A illustrates a 90° rotated view example of conductors 28 after portions 44 have been removed.

Figure 4:
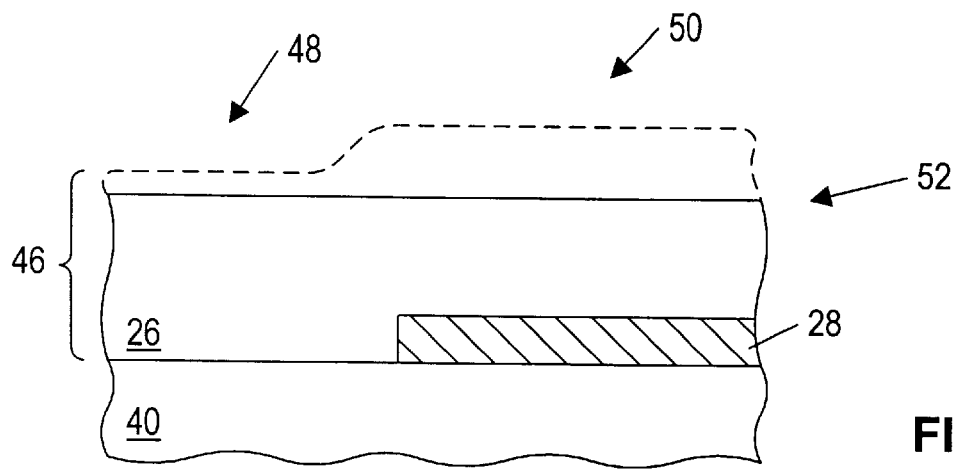
FIG. 4 is a cross-sectional view of a processing step subsequent to that shown in FIG. 3, wherein a first layer of dielectric is formed upon the first interconnect.
Figure 5:
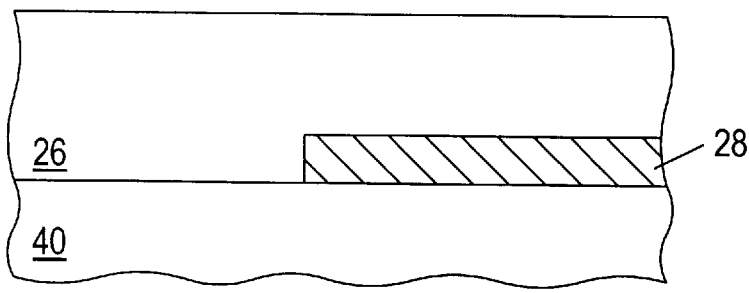
FIG. 5 is a cross-sectional view of a processing step subsequent to that shown in FIG. 4 after a planarization process.

FIGS. 4 and 5 depict deposition of a first dielectric material 46 upon and between first set of conductors 28. In regions between conductors 28, a recess 48 will form, and upon first conductors 28 a hill 50 will form. If desired, and depending upon a needed amount of planarity, the upper surfaces may be selectively polished or etched (through block masking or sacrificial removal). Planarization removes the elevational disparities between recess 48 and hill 50 to produce a substantially planar upper surface 52. Upper surface 52 comprises the upper surface of resulting first dielectric 26. It is important to note, however, that depending upon the degree of elevational disparity, planarization may not be required. If planarization is not needed, then the interim steps of polishing and/or etching is unnecessary.

Figure 6:
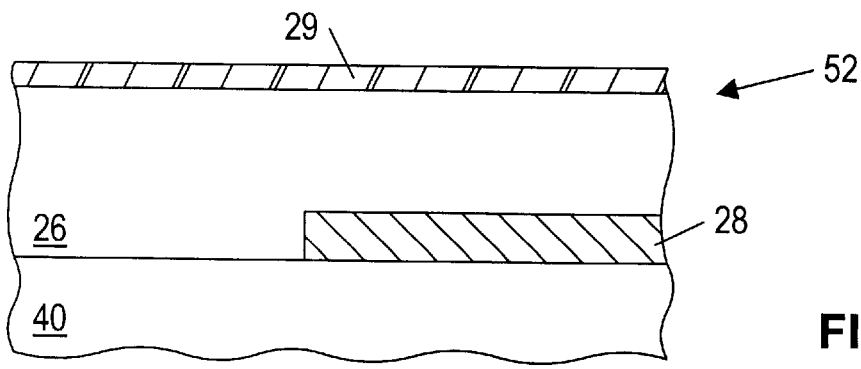
FIG. 6 is a cross-sectional view of a processing step subsequent to that shown in FIG. 5, wherein a barrier layer is formed upon the first dielectric.

FIG. 6 illustrates formation of barrier layer 29 upon upper surface 52 of first dielectric 26. Barrier layer 29 preferably comprises a material that is resistant to an oxide etch such as titanium, titanium nitride, silicon nitride, polysilicon or various metal silicides. The barrier layer may comprises a material selected from the group consisting of titanium, tungsten, and molybdenum. The barrier layer may be non-conductive and comprise $Si_3N_4$ or $Si_xO_yN_2$. Barrier layer 29 is preferably deposited to a thickness (300 to 1000 angstroms) sufficient as an etch stop during oxide etch of dielectric 26.

Figure 7:
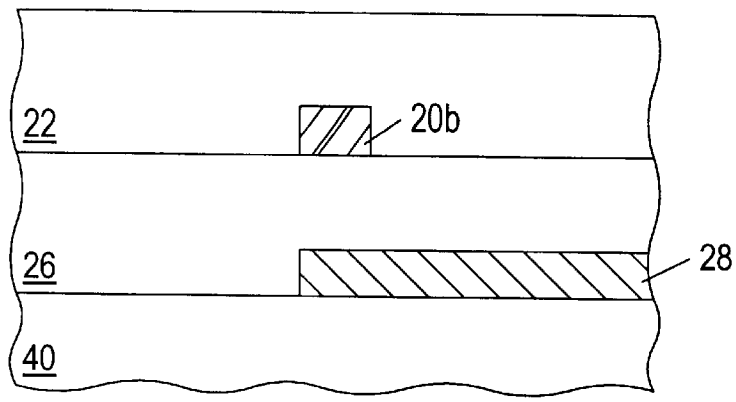
FIG. 7 is a cross-sectional view of a processing step subsequent to that shown in FIG. 6, wherein a second layer of dielectric is formed upon the first dielectric and upon the etch stop patterned from the barrier layer.

FIG. 7 illustrates the patterning of barrier layer 29 to form etch stop 20b and the deposition of a second dielectric material necessary to form second dielectric 22 upon first dielectric 26. Second dielectric 22 is deposited directly upon first dielectric 26 using, for example, chemical-vapor deposition or spin-on techniques. Etch stop 20b is preferably located directly below the position in which upper portion 18 of conductor 14b (see FIG. 2) will be located and will ultimately serve as a lower portion of conductor 14b.

Figure 8:
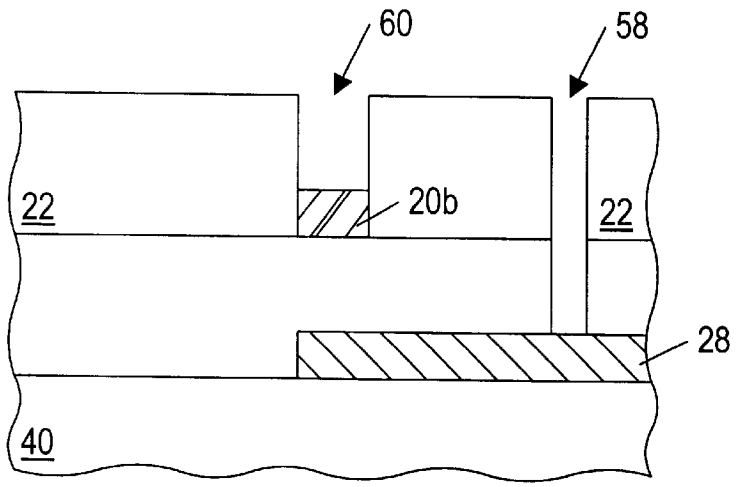
FIG. 8 is a cross-sectional view of a processing step subsequent to that shown in FIG. 7, wherein a trench is formed within the second layer of dielectric and a via is formed within the first and second dielectric layer.

FIG. 8 illustrates selective removal of second dielectric 22 over etch stop 20b to form trench 60 and the selective removal of first dielectric 22 and second dielectric 26 over conductor 28 to form via 58. The depth of via 58 is substantially equal to the combined thickness of second dielectric 22 and first dielectric 26. The depth of trench 60 is substantially equal to the thickness of first dielectric 22 minus the thickness of etch stop 20b. The base area of trench 60 is substantially equal to the base area of etch stop 20b. Also, trench 60 is placed directly above etch stop 20b and directly below an area upon which upper portion 18 of first conductor 14b will be subsequently placed. Formation of trench 60 and via 58 is accomplished with a single etch despite the different depths of trench 60 and via 58 because etch stop 20b will terminate further etching of trench 60. In addition, formation of trench 60 and via 58 does not require a timed etch since the etch process can be terminated upon detection of material used in conductor 28 such as aluminum.

Figure 9:
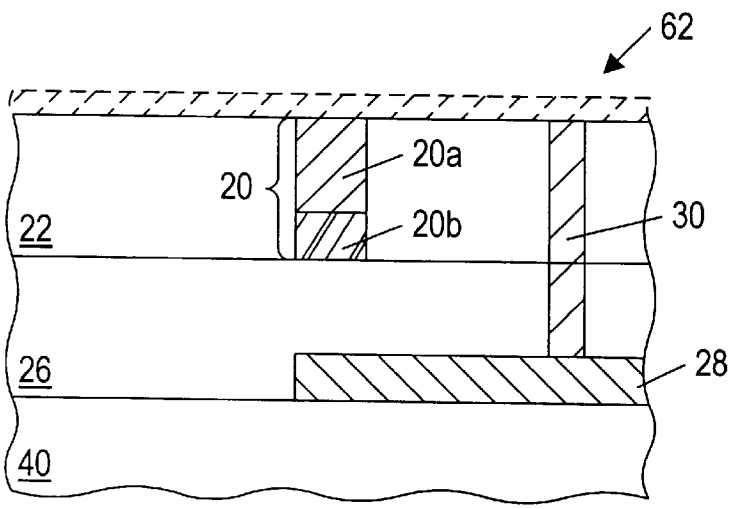
FIG. 9 is a cross-sectional view of a processing step subsequent to that shown in FIG. 8, wherein the trench and the via are filled with a plug material and excess plug material is removed from the upper surface of the second dielectric.

FIG. 9 illustrates deposition of a conductive material, suitably comprising tungsten, aluminum or copper, as depicted by reference numeral 62 to fill trench 60 and via 58. Conductive material 62 is thereafter removed from the upper surface of second dielectric 22, leaving contact 30 and lower portion 20a of first conductor 14b. Conductive material 62 is suitably deposited by chemical-vapor deposition, and suitably removed by chemical-mechanical polishing. The temperature and atmospheric conditions in which conductive material 62 is deposited varies depending upon the fill conditions and the amount of fill required. The deposition parameters are chosen so as to fill vias and trenches formed within a dielectric of moderate thickness.

Figure 10:
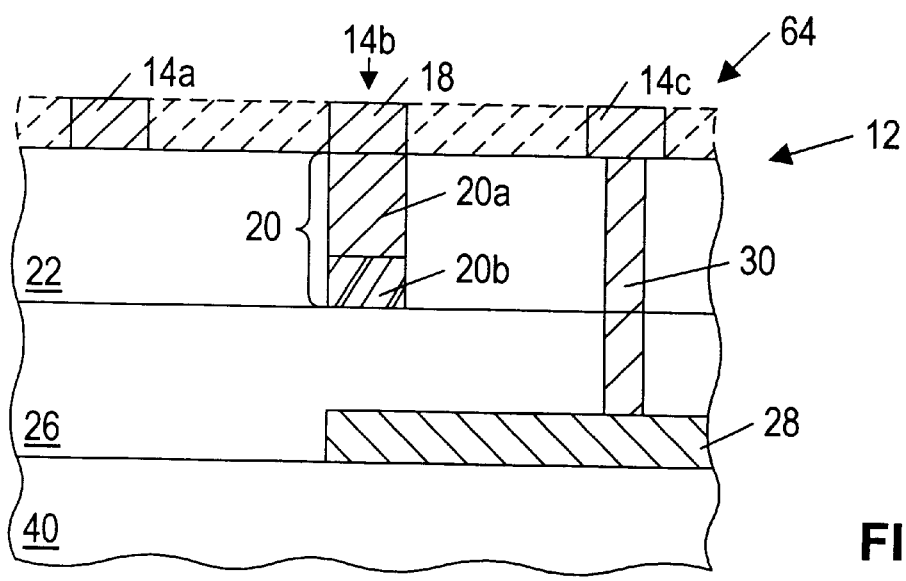
FIG. 10 is a cross-sectional view of a processing step subsequent to that shown in FIG. 9, wherein a remaining portion of the second conductor is formed.

After conductive material 62 is removed (as shown in FIG. 9), an upper dielectric surface 12 is presented upon which another layer of conductive material 64 is deposited as illustrated in FIG. 10. In this instance, conductive material 64 is deposited across the entire topographical surface 12, and subsequently removed in select regions to present conductors 14a and 14c, as well as the upper portion 18 of conductor 14b. Upper portion 18 is in direct alignment above lower portion 20, and conductor 14c is in direct alignment above contact structure 30. In another instance, conductive material 64 can be patterned to produce all three conductors 14a, 14b and 14c. Producing three conductors is achieved by limiting conductive material 64 to aluminum deposited by an improved trench and via filling capability.

Lower portion 20 of conductor 14b is advantageously produced to enhance the current-carrying capability of conductor 14b without requiring lateral encroachment of that conductor toward conductors 14a and 14c. Thus, conductor 14b can be geometrically enhanced while maintaining line-to-line minimum spacing. The thickness of first dielectric 26 insures sufficient line-to-underlying line spacing, and the thickness of second dielectric 22 ensures sufficient enhancement to conductor 14b's thickness. Advantageously, second dielectric 22 is etched for a time sufficient to detect conductive material byproduct from conductors 28. Thus, conductors 28 serve as an etch stop for formation of via 58 while etch stop 20b prevents trench 60 from penetrating into dielectric 26. Accordingly, the etch process used to form trench 60 and via 58 is not required to be a timed etch. Timed etches are inherently problematic from a manufacturing standpoint because of the inevitable variability of the process. Elimination of the timed etch is, therefore, an advantageous and desirable result.

It would be appreciated to those skilled in the art having the benefit of this disclosure that this invention is capable of applications with numerous types of MOS-processed circuits. Furthermore, it is to be understood that the form of the invention shown and described is to be taken as presently preferred embodiments. Various modifications and changes may be made to each and every processing step as would be obvious to a person skilled in the art having the benefit of this disclosure. It is intended that the following claims be interpreted to embrace all such modifications and changes and, accordingly, the specification and drawings are to be regarded in an illustrative rather than a restrictive sense.

What is claimed is:

1. A method for forming a multilevel interconnect structure, comprising:

providing a semiconductor topography, wherein said topography includes at least one conductor;

depositing a barrier layer upon said topography;

patterning said barrier layer to form an etch stop;

depositing a dielectric upon said etch stop and said topography;

removing portions of said dielectric over, but not below, said etch stop to form at least one trench and portions of said dielectric and said topography over said conductor to form at least one via;

depositing a plug material across said dielectric and into said trench and said via;

removing said plug material from an upper surface of said dielectric to form a lower portion of a first interconnect line within said trench and a contact within said via;

depositing a conductive material across the upper surface of said dielectric and across said lower portion and said contact; and removing portions of said conductive material to form an upper portion of said interconnect line, wherein said upper portion is upon said lower portion, and to form a second interconnect line over said contact.

2. The method as recited in claim 1, wherein said providing the semiconductor topography comprises covering a substantially coplanar set of conductors with an insulative material.

3. The method as recited in claim 1, wherein said trench is of larger cross sectional area than said via.

4. The method as recited in claim 1, wherein removing said plug material comprises etching said conductive material to the upper surface of said dielectric.

5. The method as recited in claim 1, wherein removing said plug material comprises polishing said conductive material to the upper surface of said dielectric.

6. The method as recited in claim 1, wherein the lower portion of the first conductor comprises a thickness substantially equal to a thickness of said dielectric.

7. The method as recited in claim 1, wherein depositing said plug material and depositing a conductive material comprise chemical-vapor depositing a plug material comprising tungsten and sputter depositing a conductive material comprising aluminum, respectively.

8. The method as recited in claim 1, wherein said removing the conductive material comprises removing a patterned photoresist layer to expose regions of the conductive material and thereafter removing the exposed regions of conductive material.

9. The method as recited in claim 1, wherein said barrier layer comprises a material selected from the group consisting of titanium, tungsten, and molybdenum.

10. The method as recited in claim 1, wherein said barrier layer is non-conductive and comprises $Si_3N_4$ or $Si_xO_yN_2$.

* * * * *